United States Patent
Wang et al.

(10) Patent No.: US 7,564,108 B2
(45) Date of Patent: Jul. 21, 2009

(54) NITROGEN TREATMENT TO IMPROVE HIGH-K GATE DIELECTRICS

(75) Inventors: Chih-Hao Wang, Hsin-Chu (TW); Ta-Wei Wang, Taipei (TW); Shang-Chih Chen, Jiadong Township (TW); Ching-Wei Tsai, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 35 days.

(21) Appl. No.: 11/115,932

(22) Filed: Apr. 27, 2005

(65) Prior Publication Data

US 2006/0131672 A1    Jun. 22, 2006

Related U.S. Application Data

(60) Provisional application No. 60/637,599, filed on Dec. 20, 2004.

(51) Int. Cl.
*H01L 21/8238* (2006.01)

(52) U.S. Cl. ............... 257/410; 257/411; 257/E21.625; 257/E21.639

(58) Field of Classification Search ......... 257/410–411, 257/E21.625, E21.639
See application file for complete search history.

(56) References Cited

U.S. PATENT DOCUMENTS

| | | | |
|---|---|---|---|
| 6,110,784 A | 8/2000 | Gardner et al. | |
| 6,380,104 B1 | 4/2002 | Yu | |
| 6,407,435 B1 | 6/2002 | Ma et al. | |
| 6,432,776 B1* | 8/2002 | Ono | 438/275 |
| 6,444,592 B1 | 9/2002 | Ballantine et al. | |
| 6,511,876 B2* | 1/2003 | Buchanan et al. | 438/240 |
| 6,689,675 B1 | 2/2004 | Parker et al. | |
| 6,703,780 B2 | 3/2004 | Shiang et al. | |
| 6,716,695 B1 | 4/2004 | Hattangady et al. | |
| 6,727,134 B1* | 4/2004 | Chen et al. | 438/216 |
| 6,737,362 B1 | 5/2004 | Chen et al. | |
| 6,750,126 B1 | 6/2004 | Visokay et al. | |
| 6,770,923 B2 | 8/2004 | Nguyen et al. | |
| 6,790,755 B2* | 9/2004 | Jeon | 438/591 |
| 6,797,644 B2 | 9/2004 | Watt et al. | |
| 6,809,370 B1* | 10/2004 | Colombo et al. | 257/310 |
| 6,875,678 B2 | 4/2005 | Jung et al. | |

(Continued)

OTHER PUBLICATIONS

Choi, C., et al., "The Effects of Nitrogen and Silicon Profile on High-K MOSFET Performance and Bias Temperature Instability," Symposium on VLSI Technology Digest of Technical Papers (2004) pp. 214-215.

(Continued)

*Primary Examiner*—Kenneth A Parker
*Assistant Examiner*—Jose R Diaz
(74) *Attorney, Agent, or Firm*—Slater & Matsil, L.L.P.

(57) ABSTRACT

A MOSFET having a nitrided gate dielectric and its manufacture are disclosed. The method comprises providing a substrate and depositing a non-high-k dielectric material on the substrate. The non-high-k dielectric comprises two layers. The first layer adjacent the substrate is essentially nitrogen-free, and the second layer includes between about $10^{15}$ atoms/$cm^3$ to about $10^{22}$ atoms/$cm^3$ nitrogen. The MOSFET further includes a high-k dielectric material on the nitrided, non-high-k dielectric. The high-k dielectric preferably includes HfSiON, ZrSiON, or nitrided $Al_2O_3$. Embodiments further include asymmetric manufacturing techniques wherein core and peripheral integrated circuit areas are separately optimized.

22 Claims, 2 Drawing Sheets

U.S. PATENT DOCUMENTS

| | | | |
|---|---|---|---|
| 6,894,369 B2 * | 5/2005 | Irino et al. | 257/637 |
| 6,897,095 B1 | 5/2005 | Adetutu et al. | |
| 6,933,225 B2 * | 8/2005 | Werkhoven et al. | 438/627 |
| 6,974,764 B2 | 12/2005 | Brask et al. | |
| 7,030,024 B2 * | 4/2006 | Ho et al. | 438/702 |
| 7,037,845 B2 | 5/2006 | Brask et al. | |
| 7,074,680 B2 | 7/2006 | Doczy et al. | |
| 7,101,753 B2 | 9/2006 | Kamiyama et al. | |
| 7,129,563 B2 | 10/2006 | Cosnier et al. | |
| 7,138,692 B2 * | 11/2006 | Tamura et al. | 257/412 |
| 7,344,934 B2 | 3/2008 | Li | |
| 2002/0137250 A1 | 9/2002 | Nguyen et al. | |
| 2003/0032281 A1 | 2/2003 | Werkhoven et al. | |
| 2005/0101147 A1 | 5/2005 | Labelle et al. | |
| 2007/0176242 A1 * | 8/2007 | Lee et al. | 257/369 |
| 2008/0001237 A1 | 1/2008 | Chang et al. | |

OTHER PUBLICATIONS

Kimizuka, N., et al., "NBTI Enhancement by Nitrogen Incorporation into Ultrathin Gate Oxide for 0.10-μm Gate CMOS Generation," Symposium on VLSI Technology Digest of Technical Papers (2000) pp. 92-93.

Sekine, K., et al., "Nitrogen Profile Control by Plasma Nitridation Technique for Poly-Si Gate HsSiON CMOSFET with Excellent Interface Property and Ultra-Low Leakage Current," IEDM (2003) pp. 103-106.

Tamura, Y., et al., "SiN-Capped HfSiON Gate Stacks with Improved Bias Temperature Instabilities for 65 nm-node Low-Standby-Power Transistors," Symposium on VLSI Technology Digest of Technical Papers (2004) pp. 210-211.

Hou, Y.T., et al., "High Performance Tantalum Carbide Metal Gate Stacks for nMOSFET Application," IEEE (2005), 4 pgs.

Chang, V.S., et al., "Modeling and Engineering of Hafnium Silicate (HfSiO) Gate Dielectric Deposited By Nano-Laminated Atomic Layer Deposition (NL-ALD)," vol. 1 (2006), in press, ECS Transaction, 11 pgs.

* cited by examiner

Periphery  Core

US 7,564,108 B2

NITROGEN TREATMENT TO IMPROVE HIGH-K GATE DIELECTRICS

This application claims the benefit of U.S. Provisional Application No. 60/637,599 filed on Dec. 20, 2004, entitled Nitrogen Treatment to Improve High-K Gate Dielectrics, which application is hereby incorporated herein by reference.

TECHNICAL FIELD

This invention relates generally to semiconductor devices and methods of manufacturing same. More particularly, this invention relates to an improved input/output transistor device having a composite gate dielectric comprising a nitrogen containing, high-k dielectric, and an underlying dielectric layer having a nitrogen containing portion in contact with the high-k dielectric layer and a non-nitrogen containing portion that is in contact with the substrate.

BACKGROUND

Gate dielectric performance and reliability is an ongoing concern in conventional CMOS processing. This concern is particularly significant as device geometries shrink to the sub-micron realm (e.g., 90 nm, 65 nm, and below) and as device reliability standards are strengthened. Two approaches are employed to increase device performance in smaller geometry devices. One approach is to decrease the thickness of the silicon dioxide gate dielectric, which will increase higher gate dielectric leakage current. Another approach is to employ so-called high-k gate dielectrics (i.e., gate dielectrics having a permittivity constant of greater than about 3.9, the permittivity of silicon oxide), which can be considerably thinner equivalent oxide thickness (EOT) than a conventional silicon oxide layer, while providing electrical insulation comparable to a considerably thicker silicon oxide layer. Due to the undesirable interactions between high-k dielectrics and the underlying semiconductor material (usually silicon, germanium, silicon germanium, and the like) to degrade carrier mobility, a thin silicon oxide layer is typically employed as part of the gate dielectric even when a high-k gate dielectric is employed.

Well known phenomena of the silicon oxide gate dielectric that can deleteriously affect device performance include charge traps such as intrinsic and extrinsic defects throughout the oxide layer, and so-called interface states at the oxide-silicon interface resulting from silicon dangling bonds. Additionally, charge trapping sites are also known to form at the interface between a nitrogen containing dielectric and a non-nitrogen containing dielectric layer, such as may be employed in the case of a silicon oxide and high-k composite gate dielectric.

It is known that the introduction of nitrogen into the silicon oxide dielectric layer, a process known as nitridation (by thermal process, or plasma process), can eliminate some of the charge trapping sites that otherwise exist. A nitrided oxide layer (or any nitrogen containing dielectric), however, may have other deleterious affects on the underlying substrate, such as nitrogen diffusion into the substrate, and poor device characteristics due to nitrogen-incorporated dopant diffusion or dopant deactivation in a source/drain and their extensions.

Particularly, negative bias temperature instability (NBTI) may be adversely impacted by the presence of a nitrogen containing material in contact with the substrate (and more particularly in contact with the channel region). While the beneficial affects of a nitrided gate electrode (such as reduced charge trap sites) may outweigh the negative effects for some transistor applications, such as core logic devices, the deleterious effects are more significant for other applications such as input/output (I/O) devices. This is because I/O transistors typically operate at higher voltages (e.g., 5V, 3.3V, 2.5V, 1.8V, or another relatively higher bias (dependent on using which technology)) than core logic and memory devices, which may operate at a voltage at a lower bias (e.g., in the 1.5, 1.2, or 1V range).

What is needed, therefore, is to find a device and manufacturing method that provides the advantageous features of a nitrided dielectric layer and a high-k dielectric layer, which will increase device and circuit performance for both peripheral (or I/O) and core devices, but not degrade or negatively impact their reliabilities.

SUMMARY OF THE INVENTION

These and other problems are generally solved or circumvented, and technical advantages are generally achieved by preferred embodiments of the present invention that provide a novel process and structure for semiconductor devices using high-k gate dielectric materials. Preferred embodiments of the invention provide a multilayer dielectric stack and method, wherein the nitrogen distribution in the gate dielectric overcomes manufacturing and reliability problems.

One preferred embodiment comprises a gate dielectric for a transistor and its method of manufacture. The dielectric comprises a nitrogen-containing high-k dielectric layer and an underlying non-high-k dielectric layer. The underlying dielectric layer comprises a nitrogen-containing first portion in contact with the high-k dielectric layer, and a substantially nitrogen-free second portion in contact with an underlying substrate. In preferred embodiments, high-k dielectrics include nitrided Hf-based high-k (e.g., $HfO_2$, HfSiO, HfON, or HfSiON), nitrided Zr-based high-K (e.g., $ZrO_2$, ZrSiO, ZrON, or ZrSiON), nitrided Al-based high-K (e.g., $Al_2O_3$, AlSiO, AlON, or AlSiON), and other suitable high-k (k>8) gate dielectric. Non-high-k dielectrics include oxide and oxynitride.

In another preferred embodiment, a semiconductor device, such as an integrated circuit, having both core and peripheral areas is defined on a substrate. The processing steps in the core and peripheral areas are asymmetric. Manufacturing structures and methods enable a processing step in one area, but not the other, and vice versa. Using this asymmetric approach to device processing, embodiments described herein are independently tailored to core and peripheral areas. In an embodiment including asymmetric processing, the channel region has a lower nitrogen content in the peripheral region than in the core region. In another embodiment, the non-high-k dielectric is thicker in the peripheral region than in the core region.

In another embodiment, the semiconductor device is a transistor. The transistor comprises a substrate, and a gate structure on the substrate. In alternate embodiments the gate structure includes a first dielectric layer on the substrate, the first dielectric layer having a substantially nitrogen free region adjacent the substrate and a nitrogen containing region adjacent the nitrogen free region; a nitrogen containing, high-k dielectric layer on the first dielectric layer; and a gate electrode on the second dielectric layer. Embodiments further include a source region and a drain region adjacent and on opposed sides, respectively, of the gate structure and defining there between a channel region, the channel region having a length of less than about 100 nm. Preferably, first dielectric layer has a dielectric constant less than about 8, and the high-k dielectric has a dielectric constant greater than about 8. Preferably, the nitrogen containing region is greater than about 1 nm thick, and the substantially nitrogen free region is greater than about 0.5 m thick.

The high-k dielectric may include silicon, oxygen, nitrogen, Hf, Ta, Al, La, Ge, Ti, Co, HfSiON, amorphous HfSiON, $Ta_2O_5$, $TiO_2$, $Al_2O_3$, $ZrO_2$, $HfO_2$, $Y_2O_3$, $La_2O_3$, aluminates, silicates, HfAlOx, $TiO_2$, $PbTiO_3$, $BaTiO_3$, $SrTiO_3$, and $PbZrO_3$, and combinations thereof.

Additional features and advantages of embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale. To more clearly illustrate certain embodiments, a letter or symbol indicating variations of the same structure, material, or process step may follow a figure number.

DETAILED DESCRIPTION OF ILLUSTRATIVE EMBODIMENTS

The operation and fabrication of the presently preferred embodiments are discussed in detail below. However, the embodiments and examples described herein are not the only applications or uses contemplated for the invention. The specific embodiments discussed are merely illustrative of specific ways to make and use the invention, and do not limit the scope of the invention or the appended claims.

Shown in FIG. 1 is a semiconductor substrate 2 employed within a microelectronics fabrication. Semiconductor substrate 2 is preferably a silicon wafer, however, substrate 2 may comprise Ge, SiGe, strained silicon, strained germanium, GaAs, silicon on insulator (SOI), SiGeOI, GeOI, a stacked arrangement of layers such as Si/SiGe, and a combination thereof. In some example, <110> or <100> channel orientation may be applied in the substrate. The silicon substrate 2 is employed within a microelectronics fabrication chosen from the group including but not limited to integrated circuit microelectronics fabrications, charge coupled device microelectronics fabrications, radiation emitting microelectronics fabrications, and optoelectronics microelectronics fabrications.

Figure 1A:
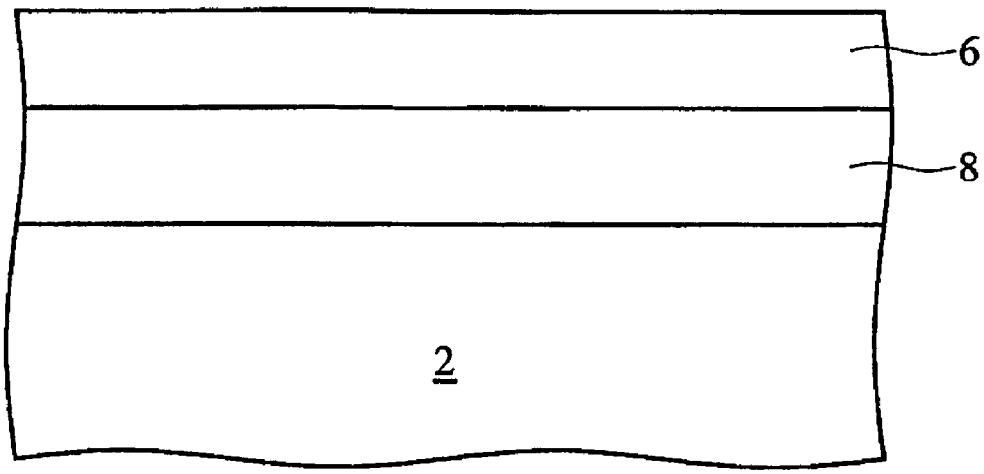
FIGS. 1a and 1b illustrate intermediate steps in the manufacture of a preferred embodiment gate dielectric and gate structure.
Figure 1B:
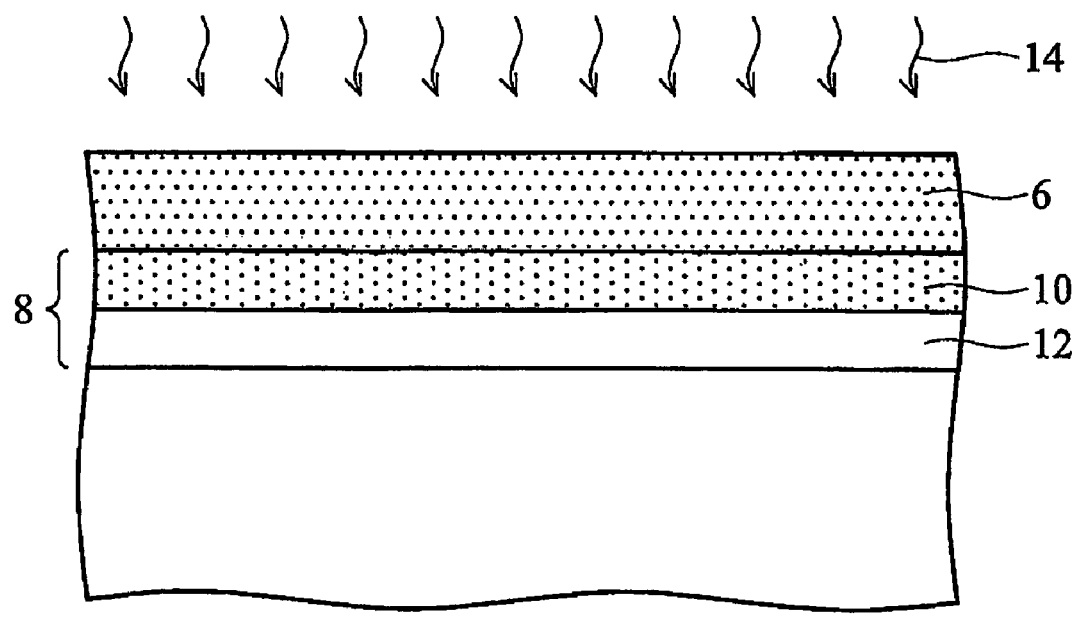

Further details of an exemplary method of manufacturing a peripheral (or I/O) device and more particularly the composite gate dielectric layer employed therein will now be provided with reference to FIGS. 1a and 1b.

A first intermediate process step, illustrated in FIG. 1a, describes the formation of a high-k dielectric layer 6 and an underlying dielectric layer 8. The underlying dielectric layer 8 is formed upon the top surface of substrate 2. The underlying dielectric layer 8 is preferably a non-high-k dielectric layer. Those skilled in the art will recognize that a thin native oxide layer (not shown) might exist on the surface of substrate 2 prior to the formation of the underlying dielectric layer 8. In another case, the thin native oxide layer is removed by a wet (e.g., HF dip) or dry (e.g., HF vapor or H-containing gas annealing) etching process. Preferably, the underlying dielectric layer 8 is a thermally grown oxide formed by subjecting substrate 2 to an oxygen ambient.

The underlying dielectric layer 8 is preferably in the range of greater than 15 Å thick, although in other embodiments a thicker or thinner oxide layer could be employed. Preferably, the underlying dielectric layer 8 is about 15 Å to 80 Å thick.

A high-k dielectric layer 6 is formed over the underlying dielectric layer 8, as illustrated in FIG. 1a. Deposition of the high-k dielectric layer 6 may be performed by conventional methods including remote plasma CVD (RPCVD), plasma enhanced CVD (PECVD), atomic layer deposition (ALD), MOCVD, MBE, PVD, sputtering or other methods known in the art.

High-k dielectrics refer to dielectrics that have a dielectric constant k greater than silicon dioxide, which is about 3.9. Preferably, the dielectric constant (k) of high-k dielectrics is larger than 8 (or permittivity>8). Possible high-k dielectrics include $Ta_2O_5$, $TiO_2$, $Al_2O_3$, $ZrO_2$, $HfO_2$, $Y_2O_3$, $L_2O_3$, and their aluminates and silicates. The high-k dielectric material may comprise a single layer of one metal oxide or several layers including two or more metal oxides. Still other possible high-k dielectrics include silicon nitride, hafnium silicon oxynitride, lanthanum oxides, and other high-k dielectric materials known in the art. The high-k dielectric 6 may also comprise any of $HfO_2$, $HfSiO_x$, HfON, HfSiON, $HfAlO_x$, zirconium such as $ZrO_2$, ZrON, ZrSiO, ZrSiON, aluminum such as $Al_2O_3$, titanium such as $TiO_2$, tantalum pentoxide, lanthanum oxide such as $La_2O_3$, barium strontium compounds such as BST, lead based compounds such as $PbTiO_3$, similar compounds such as $BaTiO_3$, $SrTiO_3$, $PbZrO_3$, PST, PZN, PZT, PMN, metal oxides, metal silicates, metal nitrides, combinations and multiple layers of these. The high-k dielectric 6 may further include Si, Ge, F, C, B, O, Al, Ti, Ta, La, Ce, Bi, W, Hf, or Zr atoms for example.

In preferred embodiments, the high-k dielectric layer 6 includes an amorphous, a crystalline, or polycrystalline material. The high-k dielectric layer 6 is typically 1-100 Angstroms thick, and it is preferably less than about 50 Å to maintain low gate leakage and thin equivalent oxide thickness (EOT).

In preferred embodiments, the high-k gate dielectric 6 is deposited over the underlying dielectric layer 8 (as shown in FIG. 1b), and then a nitrogen treatment or nitridation 14 converts both the high-k dielectric 6 and an upper portion of the underlying dielectric layer 8 with a nitrogen element (as shown in FIG. 1b). The upper portion of the underlying dielectric layer 8 is a nitrogen-containing layer 10, and the bottom portion of the underlying dielectric layer 8 is substantially nitrogen-free layer 12. The nitrogen-containing layer 10 is also referred to herein as a nitrided or nitrogenized dielectric layer, as illustrated in FIG. 1b. In one embodiment, this is accomplished by exposing the layer to a nitrogen containing plasma. According to preferred embodiments, $N_2$ plasma, $NO_x$ plasma, or $NH_x$ plasma may be used for the treatment of the high-k dielectric 6 and underlying dielectric layer 8. In another embodiment, the high-k dielectric 6 and the underlying dielectric layer 8 are nitrided by thermal nitridation. One exemplary process for thermal nitridation is using $NH_3$ nitridation or $NO_x$ nitridation.

In preferred embodiments, the underlying dielectric layer 8 advantageously provides higher mobility and higher reliability for the high-k peripheral (or I/O) device. The design of nitrogenized portion 10 of the underlying dielectric layer 8 far away channel can maintain better channel mobility, better NBTI reliability and controllable dopant profile in the S/D and channel region. Further, the imposition of the non-nitrogenated dielectric layer 12 between the nitrided dielectric layer 10 and substrate 2 prevents or substantially avoids the deleterious effects due to nitrogen-incorporating into the substrate.

In the preferred embodiments, the underlying dielectric layer 8 is substantially nitrided to a depth that is greater than 1 nm. In other words, nitrided layer 10, which may also be called a sub-layer, constitutes roughly greater than 1 nm and substantially nitrogen-free sub-layer 12 constitutes roughly greater than 0.5 nm. Preferably, the thickness of nitrogen containing sub-layer 10 ranges from about ten percent to about ninety percent of the total thickness. While not a limiting definition but rather by way of illustration, nitrogen containing implies that the concentration of nitrogen atoms in the nitrogen containing region or sub-layer is typically from about $10^{15}$ atoms/cm$^3$ to about $10^{22}$ atoms/cm$^3$.

As-deposited, high-k layers typically have a high density of traps. These traps may be passivated by impregnating the layer with greater than about 5 atomic percent of nitrogen and preferably between about 1 and 15 atomic percent. Passivation in preferred embodiments results in a trapped charge density less than $10^{12}$ cm$^{-2}$, thereby lowering leakage current and lowering EOT. Embodiments include methods for introducing nitrogen such as by diffusion from an overlay of silicon nitride, diffusion from a gas source, remote plasma nitridation, and decoupled plasma nitridation.

One embodiment comprising a method for impregnating the high-k dielectric layer 6 with nitrogen includes heating it for about 0.5 to 500 minutes at about 500 to 900° C., preferably in ammonia, nitrous oxide, and nitric oxide, and a combination thereof.

Another embodiment includes remote plasma nitridation of high-k dielectric layer 6 for about 0.5 to 60 minutes at about 200 to 1,000° C., preferably in ammonia, nitrogen, nitrous oxide, and nitric oxide, and a combination thereof. A preferred method of performing remote plasma nitridation is at about 550° C. for about 1 minute in nitrogen.

Yet another embodiment for passivating traps in high-k layers, e.g., 6, includes using decoupled plasma nitridation for about 0.1 to 60 minutes at about 10 to 400° C., preferably in ammonia, nitrogen, nitrous oxide, and nitric oxide, and a combination thereof. A preferred method of performing decoupled plasma nitridation is at about 25° C. (or at room temperature) for about 30 seconds in nitrogen.

In one example, a high-k dielectric layer 6 of $Hf_wSi_xO_yN_z$ (HfSiON) was deposited to a thickness of about 5 to 50 Angstroms and having an equivalent oxide thickness (EOT) of less than about 2.0 nanometers.

Yet another broad class of embodiments addresses the emerging applications for the rapidly growing network proliferation era, such as high performance broadband devices and circuits. System-on-chip (SOC) solutions, offering high performance transistors and embedded high density memories, are necessary to implement the high performance broadband devices, which help to scale up bandwidth and achieve desired high speeds and operating frequencies.

A system-on-chip (SOC) may include memory cell (e.g., DRAM, SRAM, Flash, EEPROM, EPROM), logic, analog and I/O devices. Logic circuits and some I/O devices usually need high performance transistors to achieve faster signal transitions. PMOS logic devices and certain I/O devices that require high drive current may be manufactured using selectively epitaxially grown strained material (e.g., SiGe) in the source and drain regions. Likewise, for certain NMOS transistors of the SOC, enhanced electron mobility is desired. Enhanced electron mobility may be obtained by, e.g., a tensile film (e.g., $Si_3N_4$), which film may be deposited with an inherent tensile stress. This tensile stress will be transferred to the underlying channel for promoting electron mobility.

For other devices, however, speed performance is not as crucial. Some logic circuit devices, memory cell devices, and I/O devices or analog devices that do not require high drive current may be manufactured without the strain material or strain methodologies. These devices would not suffer from the concerns of manufacturing complexity, cost, and yield loss that affect the high drive current devices that do employ advanced technology.

In light of these needs, embodiments described below include asymmetric, system-on-chip (SOC) manufacturing optimization. For example, the SOC comprises a peripheral area (first region) and a core area (second region), which are defined on a substrate. The processing steps in the core and peripheral areas may be asymmetric. Manufacturing structures and methods may enable a processing step in one area, but not the other, and vice versa. Using this approach in device processing, embodiments described herein are independently tailored to core and peripheral areas.

Preferably, the peripheral region includes an I/O region and an analog region, and a combination thereof. Preferably, the core region includes a logic region and a memory region, and a combination thereof. In other embodiments, analog devices or I/O devices may be included in the core area while other devices may comprise the non-core area.

In preferred embodiments, a non-high-k dielectric is deposited in both core and peripheral areas. As with embodiments described above, the dielectric includes two layers. In accordance with asymmetric SOC requirements, the first and second non-high-k layers within the core and peripheral regions are independently optimized. In the peripheral area, the gate dielectric thickness should be greater than in the core area. In the peripheral area, the nitrogen concentration near the dielectric/substrate interface should be less than in the core area. In another embodiment, the dielectric includes two layers only in I/O devices but includes only a nitrided layer 10 in core devices.

Figure 2:
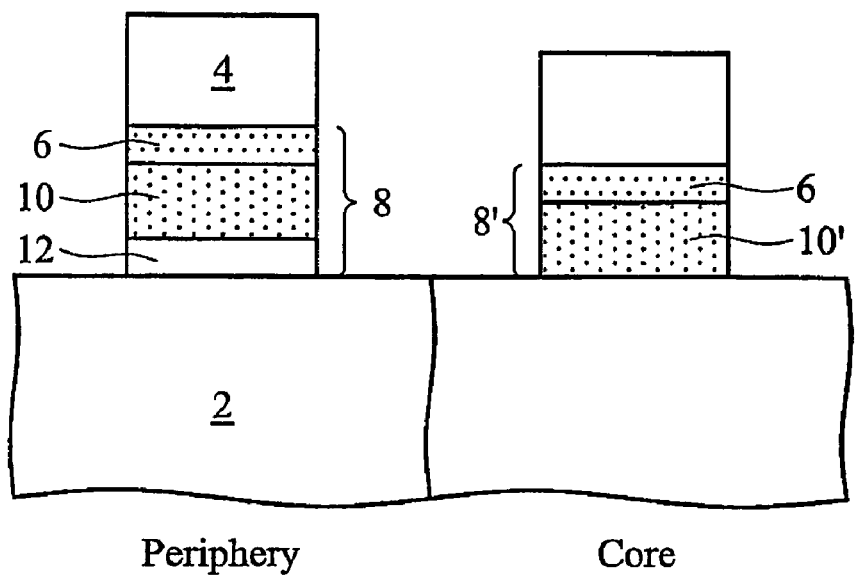
FIG. 2 illustrates a preferred embodiment of an intermediate integrated circuit including both an exemplary core device and an exemplary periphery device.

A preferred embodiment comprising asymmetric manufacturing methods and structures is illustrated in FIG. 2. In keeping with embodiments already described and already set forth in FIG. 1, there is shown in FIG. 2 a schematic cross section of the substrate 2. The substrate 2 includes a core region and a peripheral region. An underlying dielectric layer 8 is deposited on substrate 2 in the peripheral region. As described above, dielectric 8 is partially nitrided such that there is a nitrided layer 10 over an essentially un-nitrided layer 12. An underlying dielectric layer 8' is deposited on substrate 2 in the core region, in which dielectric 8' is substantially nitrided as a nitrided layer 10'. In further keeping with the preferred asymmetric processing embodiment shown in FIG. 2, the nitrided dielectric layer 10 in the periphery may be thicker than the nitrided layer 10' in the core. Accordingly, nitrided dielectric layer 10 is preferably between about 10 Å to 50 Å in the periphery and preferably less than nitrided dielectric layer 10' about 10 Å or less than 30 Å in the core. In further keeping with the preferred manufacturing processes, the channel region (or substrate surface) under dielectric 8 (or 8') has a lower nitrogen concentration in the periphery than in the core due to less nitrogen penetration during nitridation processes.

The nitrogen distribution within dielectric layers 10, 10' may be homogeneous or it may be non-homogeneous, i.e., graded. Conventional methods exist for creating a suitably graded, dielectric nitrogen profile. Once such conventional technique employing ALD is set forth in U.S. Patent Application Publication No. 2003/0032281 by Werkhoven et al., and is hereby incorporated by reference.

Returning briefly to FIG. 2, nitrided dielectric layer 10 may include a graded nitrogen composition profile. Embodiments may comprise a profile wherein there is substantially 0% nitrogen near the un-nitrided dielectric 12. In keeping with asymmetric processing embodiments, nitrogen may be independently distributed or graded within the core and peripheral areas. Or, dielectric layer 10 may be homogeneous, and dielectric layer 12 may be graded, but with the nitrogen level preferably essentially zero at the dielectric layer/substrate interface.

Continuing with FIG. 2, a high-k dielectric layer 6 is deposited over nitrided dielectrics 10, 10'. An electrode 4 is deposited on high-k dielectric layer 6.

Applicants fabricated test MOSFETs having nitrided Hf silicate (HfSiON or HfON) high-k gate dielectrics according to preferred embodiments set forth herein. For reliability evaluation (e.g., NBTI, PBTI, HCI, or TDDB), devices were stressed under either inversion or accumulation mode at room and elevated temperature. Both I/O and core devices with more than 10 years lifetime were estimated using conventional evaluation methods.

Figure 3:
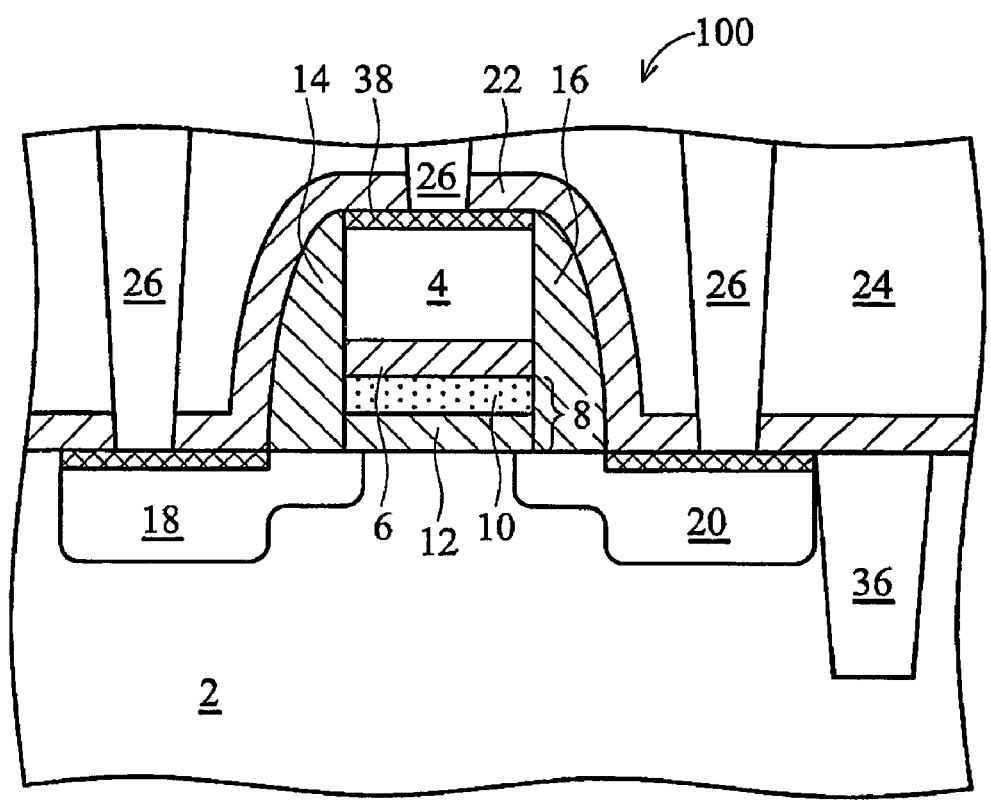
FIG. 3 illustrates in cross sectional view of an exemplary transistor device employing a preferred embodiment gate dielectric.

Finally, conventional processing, as known in the art, is followed to complete the construction corresponding to the microelectronics device of FIG. 1. FIG. 3 shows a schematic cross-sectional diagram illustrating the final result of further processing of a MOSFET device 100 corresponding to the cross-sectional diagram in FIG. 1.

The device 100, which may include a transistor, is formed within or on a substrate 2, illustrated as a bulk silicon wafer, but one skilled in the art will recognize that substrate 2 could be a semiconductor layer formed atop a buried oxide layer on a supporting substrate, in the well-known silicon on insulator (SOI) structure. Substrate 2 may further comprise Ge, SiGe, SiGeC, GeOI, SiGeOI, strained silicon, strained germanium, GaAs, a stacked arrangement of layers such as Si/SiGe, and a combination thereof. In some examples, <110> or <100> channel orientation may be applied in the substrate 2.

Transistor 100 includes a gate structure, which is comprised of a gate electrode 4 overlying a high-k dielectric layer 6, which in turn overlies an underlying dielectric layer 8, preferably formed of silicon oxide. Gate electrode material 4 is preferably a polysilicon, silicide, or metal gate electrode material. The electrode may be deposited by a conventional CVD, PVD or other suitable process to a thickness less than about 2000 Angstroms. Underlying dielectric layer 8 has a first, nitrided portion 10 that is in contact with high-k dielectric layer 6 and a second non-nitrided, or substantially nitrogen-free, portion 12 that is in contact with the underlying substrate 2.

Sidewall spacers 14, 16 are shown on either side of the gate structure. Sidewall spacers 14 and 16 are deposited and patterned on sidewalls coextensive and on either side of the gate electrode 4, the high-k dielectric 6, and the dielectric 8. Sidewall spacers 14 and 16 are deposited using a non-high-k dielectric to provide a protective spacer over the sidewalls of the gate electrode 4. Most of the sidewall spacers 14, 16 are composite spacers, e.g., ON (silicon oxide/oxynitride-silicon nitride), NO, ONO, ONON, NONO spacers. The bottom layer (preferably<8 nm, not shown) of sidewall spacers 14 and 16 is preferably a nitrogen containing layer (e.g., silicon nitride) to prevent a sub-oxide layer from being formed in the gate electrode to high-k interface, and may be deposited by low temperature or high temperature deposition techniques including LPCVD, RTCVD, PECVD and remote plasma (RPCVD). The sidewall spacers 14 and 16 may comprise silicon nitride, silicon oxide, or silicon oxynitrides.

Continuing with FIG. 3, source and drain regions 18, 20 are illustrated as being formed in the substrate 2, each having a shallow region (frequently referred to as an extension region or a lightly doped drain (LDD) region) and a deep region (usually referred to simply as the source or drain region, or sometimes referred to as a heavily doped region). One skilled in the art will recognize that numerous variations to the source/drain regions may be employed while still benefiting from the advantageous features of the present invention. For instance, the source drain regions could be implanted regions within the substrate 2, or could alternatively be epitaxially grown regions of, e.g., silicon, silicon germanium, silicon carbon, germanium, or the like. Additionally, although source/drain regions 18, 20 are illustrated as being formed within substrate 2, in other embodiments the regions could be formed partially or entirely above the top surface of the substrate. Likewise, the symmetrical arrangement of source/drain regions 18, 20 could be asymmetrical in other embodiments with only one, or no, extension region being employed, or with additional regions of doping concentration being employed (symmetrically or asymmetrically) in order to provide one or more graded junction profiles.

In preferred embodiments the gate electrode 4 includes a dopant of a first conductivity type, while the device source and drain regions include a dopant having a second conductivity type, as described below. For example, a p+ doped poly gate or a p-type metal is used for PMOS, and an n+ doped poly gate or an n-type metal is used for NMOS. For example, in a gate electrode using an accumulation mode operation to improve electrical oxide thickness, the PMOS gate electrode is preferably n+ doped, while the NMOS gate electrode is preferably p+ doped. A spike, flash, or laser activation anneal is done at approximately the range of 900~1300° C., preferably at about 1050° C.

Depending on the type of dopants used in the source/drain and the substrate, the transistors may be of a P type MOS transistor or an N type MOS transistor. In a complementary MOS transistor integrated circuit, the transistors may be formed in well diffusions (not shown) that were performed prior to shallow trench isolation (STI) 36 or LOCOS isolation (not shown) formation, as is known in the art, the wells being isolated by the STI regions 36.

The exemplary embodiments described herein do not preclude using additional materials and methods to increase performance. For example, a strained channel material such as SiGe is known in the art to increase the mobility of the carriers, which is particularly important in the production of P type MOS transistors. The strained channel material is deposited, for example, by epitaxial growth using in situ doping. It is preferably less than about 200 Angstroms, and in preferred embodiments, it is about 100 Angstroms. The strain material may be any of several semiconductor materials; compound or multilayer materials may be used, including Si, strained Si, SOI, SiC, SiGe, SiGeC, SiGeOI, Ge, GeOI, strained Ge, and combinations of these. In some examples, <110> or <100> channel orientation may be applied in the substrate. In an example illustrated in FIG. 3, after formation of the gate structure, the spacers, and the source/drain regions, a contact etch stop layer (CESL) 22 is formed over the device 100. In one example, the oxide or oxynitride CESL formed by CVD may be used. In another example, CESL 22 is silicon nitride and, as is known in the art, may be deposited with an inherent compressive (for PMOS) or tensile (for NMOS) stress in order to impose strain upon the underlying substrate and thus enhance mobility (i.e., electron or hole mobility).

In further accordance with conventional processing, as is known in the art, for example, a silicide may be formed by depositing a metal such as nickel, titanium or cobalt and then treating it to form a self-aligned silicide, or a salicide, on top of a gate electrode 38, the source/drain regions and other areas to provide a lower resistance and improve device performance. Following the salicide step, if used, interlevel insulation layers 24 are formed above the substrate 2 using deposition steps to deposit oxide, nitride or other conventional insulation layers, typically silicon dioxide is formed. Contact areas are patterned and etched into the insulators to expose the source/drain and gate electrodes 38, the resulting vias 26 are filled with conductive material to provide electrical connectivity from metallization layers above the interlevel insulating layers 24 down to the gate electrodes and the source/drain regions. Metallization layers of aluminum or copper may be formed over the interlevel insulation layers 24 using known techniques such as an aluminum metallization process or a dual damascene copper metallization process to provide one, or several, wiring layers that may contact the vias 26 and make electrical connections to the gate electrodes and the source/drain regions. Conventional clean up, passivation, die saw, singulation, packaging, assembly and test steps are used to complete the integrated circuit devices formed on the substrate 2.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A gate dielectric for use in a transistor comprising:
a high-k dielectric layer having a thickness from about 5 to 50 Å, the high-k dielectric layer comprising nitrogen interspersed throughout the high-k dielectric layer; and
an underlying dielectric layer having a thickness from about 15 to 80 Å, the underlying dielectric layer having a nitrogen-containing first portion in contact with the high-k dielectric layer, and a substantially nitrogen-free second portion in contact with an underlying substrate, the nitrogen-free second portion comprising a first material and the nitrogen-containing first portion comprising the first material and nitrogen, the nitrogen-containing first portion having a steadily decreasing concentration of nitrogen from the high-k dielectric layer to the nitrogen-free second portion.

2. The gate dielectric of claim 1, wherein the high-k dielectric layer has a permittivity of greater than about 8.

3. The gate dielectric of claim 1, wherein the underlying dielectric layer has a dielectric constant less than about 8.

4. The gate dielectric of claim 1, wherein the nitrogen-containing first portion of the underlying dielectric layer has a thickness greater than about 1 nm.

5. The gate dielectric of claim 1, wherein the substantially nitrogen-free second portion of the underlying dielectric layer has a thickness greater than about 0.5 nm.

6. The gate dielectric of claim 1, wherein the high-k gate dielectric comprises a material selected from the group consisting essentially of silicon, oxygen, nitrogen, Hf, Ta, Al, La, Ge, Ti, Co, HfSiON, amorphous HfSiON, $Ta_2O_5$, $TiO_2$, $Al_2O_3$, $ZrO_2$, $HfO_2$, $Y_2O_3$, $La_2O_3$, aluminates, silicates, HfAlOx, $TiO_2$, $PbTiO_3$, $BaTiO_3$, $SrTiO_3$, and $PbZrO_3$, and combinations thereof.

7. The gate dielectric of claim 1, wherein the underlying substrate comprises a material selected from the group consisting essentially of Si, strained Si, Ge, SiC, SiGe, SiGeC, strained SiGe, SOI, SiGeOI, GeOI, GaAs, a stacked arrangement of layers, and combinations thereof.

8. A transistor comprising:
a substrate;
a gate structure comprising;
a first dielectric layer on the substrate having a thickness from about 15 to 80 Å, the first dielectric layer having a substantially nitrogen-free region adjacent the substrate and a nitrogen-containing region adjacent the nitrogen-free region, the nitrogen-containing region comprising nitrogen and substantially the same non-metallic compound as the substantially nitrogen-free region, the nitrogen concentration continuously increasing through the nitrogen-containing region from the nitrogen-free region;
a nitrogen-containing, high-k dielectric layer on the first dielectric layer having a thickness from about 5 to 50 Å, wherein the nitrogen is distributed throughout the high-k dielectric layer;
a gate electrode on a second dielectric layer; and
a source region and a drain region adjacent and on opposed sides, respectively, of the gate structure and defining there between a channel region, the channel region having a length of less than about 100 nm.

9. The transistor of claim 8, wherein the first dielectric layer has a dielectric constant less than about 8.

10. The transistor of claim 8, wherein the nitrogen-containing region is greater than about 1 nm thick.

11. The transistor of claim 8, wherein the substantially nitrogen-free region is greater than about 0.5 nm thick.

12. The transistor of claim 8, wherein the high-k dielectric has a dielectric constant greater than about 8.

13. The transistor of claim 8, wherein the high-k dielectric comprises a material selected from the group consisting essentially of silicon, oxygen, nitrogen, Hf, Ta, Al, La, Ge, Ti, Co, HfSiON, amorphous HfSiON, $Ta_2O_5$, $TiO_2$, $Al_2O_3$, $ZrO_2$, $HfO_2$, $Y_2O_3$, $La_2O_3$, aluminates, silicates, HfAlOx, $TiO_2$, $PbTiO_3$, $BaTiO_3$, $SrTiO_3$, and $PbZrO_3$, and combinations thereof.

14. A semiconductor device having a core region and an input/output (I/O) region on a substrate, the semiconductor device comprising:
   an underlying dielectric layer on the substrate, the underlying dielectric layer having a first thickness over the I/O region and a second thickness over the core region, wherein the first thickness is greater than the second thickness; and
   a high-k dielectric layer on the underlying dielectric layer over the I/O region and the core region, wherein the underlying dielectric layer over the I/O region is partially nitrided, and the underlying dielectric layer over the core region is fully nitrided;
   wherein the underlying dielectric layer over the I/O region comprises a first chemical compound in direct contact with both the high-k dielectric layer and the substrate.

15. The semiconductor device of claim 14, wherein the underlying dielectric layer has a dielectric constant less than about 8.

16. The semiconductor device of claim 14, wherein the first thickness is at least about 0.1 nm greater than the second thickness.

17. The semiconductor device of claim 14, wherein an upper first portion of the underlying dielectric layer over the I/O region is nitrogen-containing and a bottom second portion of the underlying dielectric layer over the I/O region is substantially nitrogen-free.

18. The semiconductor device of claim 17, wherein the upper first portion of the underlying dielectric layer has a thickness greater than about 1 nm.

19. The semiconductor device of claim 17, wherein the bottom second portion of the underlying dielectric layer has a thickness greater than about 0.5 nm.

20. The semiconductor device of claim 14, wherein the high-k dielectric layer has a dielectric constant greater than about 8.

21. The semiconductor device of claim 14, wherein the underlying dielectric layer over the core region is less than about 1.5 nm thick.

22. The semiconductor device of claim 14, wherein the high-k dielectric layer comprises a material selected from the group consisting essentially of silicon, oxygen, nitrogen, Hf, Ta, Al, La, Ge, Ti, Co, HfSiON, amorphous HfSiON, $Ta_2O_5$, $TiO_2$, $Al_2O_3$, $ZrO_2$, $HfO_2$, $Y_2O_3$, $La_2O_3$, aluminates, silicates, HfAlOx, $TiO_2$, $PbTiO_3$, $BaTiO_3$, $SrTiO_3$, and $PbZrO_3$, and combinations thereof.

\* \* \* \* \*

UNITED STATES PATENT AND TRADEMARK OFFICE
CERTIFICATE OF CORRECTION

PATENT NO.        : 7,564,108 B2                              Page 1 of 1
APPLICATION NO. : 11/115932
DATED             : July 21, 2009
INVENTOR(S)       : Wang et al.

It is certified that error appears in the above-identified patent and that said Letters Patent is hereby corrected as shown below:

In Col. 3, line 3, delete "0.5 m" and insert --0.5 nm--.
In Col. 7, line 35, delete "HCl" and insert --HCI--.

Signed and Sealed this

First Day of September, 2009

David J. Kappos
*Director of the United States Patent and Trademark Office*